(12) United States Patent
Moriwaki

(10) Patent No.: US 10,685,701 B2
(45) Date of Patent: Jun. 16, 2020

(54) SEMICONDUCTOR STORAGE DEVICE

(71) Applicant: SOCIONEXT INC., Kanagawa (JP)

(72) Inventor: Shinichi Moriwaki, Kanagawa (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/407,084

(22) Filed: May 8, 2019

(65) Prior Publication Data

US 2019/0267079 A1    Aug. 29, 2019

Related U.S. Application Data

(63) Continuation of application No. PCT/JP2017/037378, filed on Oct. 16, 2017.

(30) Foreign Application Priority Data

Nov. 9, 2016   (JP) .................. 2016-218676

(51) Int. Cl.
*G11C 11/41* (2006.01)
*G11C 11/418* (2006.01)
*G11C 11/412* (2006.01)
*G11C 11/419* (2006.01)
*G11C 8/16* (2006.01)
(Continued)

(52) U.S. Cl.
CPC .......... *G11C 11/418* (2013.01); *G11C 11/412* (2013.01); *G11C 11/419* (2013.01); *G11C 7/02* (2013.01); *G11C 7/1015* (2013.01); *G11C 8/16* (2013.01)

(58) Field of Classification Search
None
See application file for complete search history.

(56) References Cited

U.S. PATENT DOCUMENTS

2006/0092740 A1   5/2006  Nii
2007/0030741 A1   2/2007  Nii et al.
(Continued)

FOREIGN PATENT DOCUMENTS

JP    S60-111394 A    6/1985
JP    S62-076092 A    4/1987
(Continued)

OTHER PUBLICATIONS

Jason Stinson et al., "A 1.5GHz Third Generation Itanium Processor", IEEE, ISSCC(International Solid-State Cirucuits Conference) 2003, Feb. 11, 2003.
(Continued)

*Primary Examiner* — Tan T. Nguyen
(74) *Attorney, Agent, or Firm* — McDermott Will & Emery LLP

(57) ABSTRACT

Disclosed is a semiconductor storage device having a dual-port SRAM cell with a smaller area and low-current consumption and securing a good static noise margin. The semiconductor storage device includes a memory cell circuit constituting the dual port SRAM cell comprised of six transistors. When driving the first or second word line, a word line driver circuit lowers a high-level voltage which is to be output to the driven word line such that the high-level voltage is lower than a high-level voltage which is to be output to both of the first and second word lines when driving both the first and second word lines.

4 Claims, 7 Drawing Sheets

(51) Int. Cl.
　　　*G11C 7/02*　　　(2006.01)
　　　*G11C 7/10*　　　(2006.01)

(56) References Cited

U.S. PATENT DOCUMENTS

| | | | | |
|---|---|---|---|---|
| 2009/0303776 A1* | 12/2009 | Mair | ................... | G11C 11/412 |
| | | | | 365/154 |
| 2013/0077387 A1* | 3/2013 | Yabuuchi | .............. | G11C 11/419 |
| | | | | 365/154 |
| 2014/0204656 A1* | 7/2014 | Kumar | .................. | G11C 11/419 |
| | | | | 365/154 |

FOREIGN PATENT DOCUMENTS

| JP | 2006-127669 A | 5/2006 |
|---|---|---|
| JP | 2007-066493 A | 3/2007 |

OTHER PUBLICATIONS

International Search Report issued in International Application No. PCT/JP2017/037378, dated Nov. 21, 2017; with English translation.

* cited by examiner

DUAL-PORT SRAM CELL

ONE-PORT SRAM CELL

SEMICONDUCTOR STORAGE DEVICE

CROSS-REFERENCE TO RELATED APPLICATIONS

This is a continuation of International Application No. PCT/JP2017/37378 filed on Oct. 16, 2017, which claims priority to Japanese Patent Application No. 2016-218676 filed on Nov. 9, 2016. The entire disclosures of these applications are incorporated by reference herein.

BACKGROUND

The present disclosure relates to a semiconductor storage device having a dual-port (DP) static random access memory (SRAM) cell.

The dual-port SRAM cell is a memory cell in which two data access requests can be made within one cycle. As shown in FIG. 7A, a typical dual-port SRAM cell is connected to two word lines and two pairs of bit lines, and is comprised of eight transistors. In contrast, as shown in FIG. 7B, a typical one-port SRAM cell is connected to one word line and one pair of bit lines, and is comprised of six transistors. Compared with this one-port SRAM cell, the dual-port SRAM cell is larger in number of the transistors and size of the transistors. This increases the cell area and current consumption per bit.

To solve the problem of such a dual-port SRAM cell, Jason Stinson et al., "A 1.5 GHz Third Generation Itanium Processor", IEEE, ISSCC (International Solid-State Circuits Conference) 2003 discloses a configuration of a dual-port SRAM cell comprised of six transistors, which is the same as those in a one-port SRAM cell. In this circuit configuration, a word line of the one-port SRAM is separated into two word lines, so that the separated two word lines respectively drive two access transistors. Thus, the SRAM cell comprised of six transistors allows simultaneous access to two ports. This can reduce the cell area and the current consumption.

SUMMARY

However, according to the studies of the present inventors, they found that the configuration of the dual-port SRAM cell disclosed in Jason Stinson et al., "A 1.5 GHz Third Generation Itanium Processor", IEEE, ISSCC (International Solid-State Circuits Conference) 2003 deteriorates an operating margin (static noise margin (SNM)) during read operation.

The present disclosure attempts to provide a semiconductor storage device having a dual-port SRAM cell with a smaller area and low-current consumption, and to reliably secure a static noise margin without deteriorating a write margin.

One aspect of the present disclosure is directed to a semiconductor storage device including: a memory cell circuit connected to first and second word lines and first and second bit lines; and a word line driver circuit configured to drive the first and second word lines. The memory cell circuit includes: a first P-type transistor provided between a high-potential power supply line and a first node; a first N-type transistor provided between the first node and a low-potential power supply line, and having a gate connected to a gate of the first P-type transistor; a second P-type transistor provided between the high-potential power supply line and a second node; a second N-type transistor provided between the second node and the low-potential power supply line, and having a gate connected to a gate of the second P-type transistor; a third N-type transistor provided between the first node and the first bit line, and having a gate connected to the first word line; and a fourth N-type transistor provided between the second node and the second bit line, and having a gate connected to the second word line. The first node is connected to the gate of the second P-type transistor and the gate of the second N-type transistor, and the second node is connected to the gate of the first P-type transistor and the gate of the first N-type transistor. When driving the first or second word line, the word line driver circuit makes a high-level voltage which is to be output to the driven word line lower than a high-level voltage which is to be output to both the first and second word lines when driving both the first and second word lines.

According to this aspect, the semiconductor storage device includes a memory cell circuit which constitutes a dual-port SRAM cell comprised of six transistors. When driving the first or second word line, the word line driver circuit lowers a high-level voltage which is to be output to the driven word line such that the high-level voltage is lower than a high-level voltage which is to be output to both the first and second word lines when driving both the first and second word lines. This improves a static noise margin without deteriorating the write margin.

The present disclosure can provide a semiconductor storage device having a dual-port SRAM cell with a smaller area and low-current consumption, and secure a good static noise margin without deteriorating a write margin.

DETAILED DESCRIPTION

An embodiment will be described in detail with reference to the drawings. In the following description, it is assumed that "VDD" denotes a high-potential power supply line or a power supply voltage supplied to the high-potential power supply line, and "VSS" denotes a low-potential power supply line or a power supply voltage supplied to the low-potential power supply line.

Figure 1:
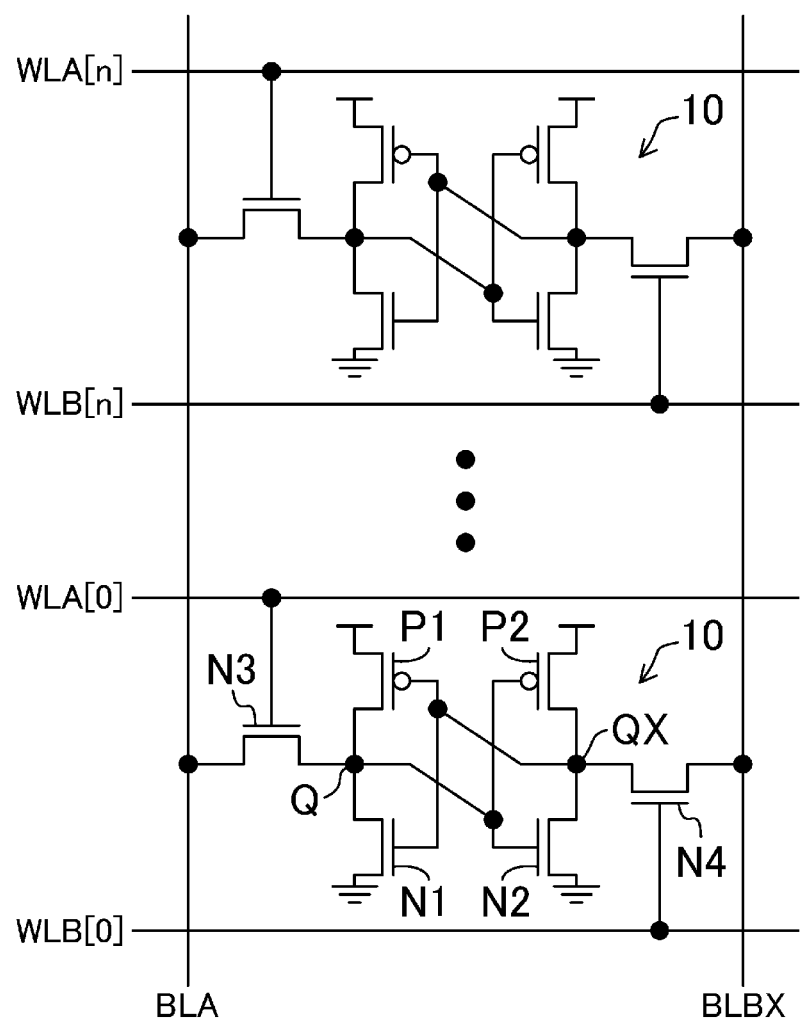
FIG. 1 is a circuit diagram of a memory cell circuit according to an embodiment.

FIG. 1 is a circuit diagram of a memory cell circuit according to the embodiment. A memory cell circuit 10 shown in FIG. 1 is connected to a first word line WLA, a second word line WLB, a first bit line BLA, and a second bit line BLBX, and constitutes a dual-port (DP) static random access memory (SRAM) cell. The first word line WLA and the second word line WLB are provided for each row of a memory cell array, which will be described later, and the number bracketed in FIG. 1 indicates a row address. Further, the first bit line BLA and the second bit line BLBX are provided for each column of the memory cell array, which will be described later.

The memory cell circuit 10 is comprised of six transistors, namely, two P-type transistors P1 and P2, and four N-type transistors N1, N2, N3, and N4. The transistor P1 serving as a first P-type transistor is provided between a VDD (high-potential power supply line) and a first node Q. The transistor N1 serving as a first N-type transistor is provided between a VSS (low-potential power supply line) and the first node Q. The gates of the transistors P1 and N1 are connected to each other, thereby constituting an inverter. The transistor P2 serving as a second P-type transistor is provided between the VDD and a second node QX. The transistor N2 serving as a second N-type transistor is provided between the VSS and the second node QX. The gates of the transistors P2 and N2 are connected to each other, thereby constituting an inverter. The first node Q is connected to the gates of the transistors P2 and N2, and the second node QX is connected to the gates of the transistors P1 and N1. In other words, the output of one inverter is connected to the input of the other inverter, thereby forming a latch.

The transistor N3 serving as a third N-type transistor and the transistor N4 serving as a fourth N-type transistor are access transistors. The transistor N3 is provided between the first node Q and the first bit line BLA, and has a gate connected to the first word line WLA. The transistor N4 is provided between the second node QX and the second bit line BLBX, and has a gate connected to the second word line WLB.

Figure 2:
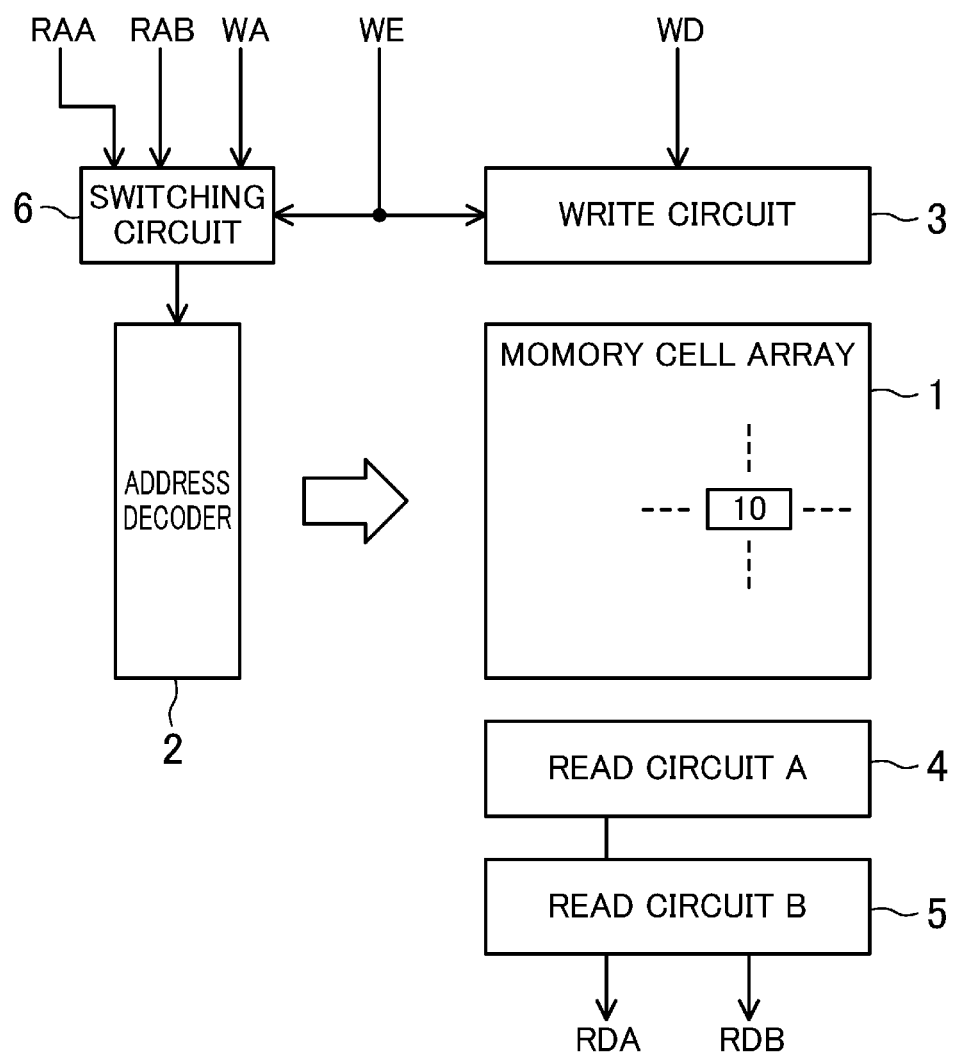
FIG. 2 illustrates an overall configuration of a semiconductor storage device.

FIG. 2 illustrates an overall configuration of a semiconductor storage device having the memory cell circuits 10 of FIG. 1. In FIG. 2, the memory cell circuits 10 of FIG. 1 are arranged in an array pattern in a memory cell array 1. In the memory cell array 1, two word lines, i.e., the word lines WLA and WLB extending in the row direction (in the horizontal direction in FIG. 2) are arranged in each row. Two bit lines, i.e., the bit lines BLA and BLBX extending in the column direction (in the vertical direction in FIG. 2) are arranged in each column. An address decoder 2 receives a read address RAA or RAB or a write address WA, decodes the address RAA, RAB, WA, and outputs an address signal for driving the word lines WLA and WLB having the address. A write circuit 3 receives write data WD, and imparts a write signal obtained by converting the write data WD to the bit lines BLA and BLBX of memory cell array 1. WE is a write pulse signal. A read circuit A 4 is connected to the first bit line BLA of the memory cell array 1, and outputs the data output to the first bit line BLA in the selected column as read data RDA. A read circuit B 5 is connected to the second bit line BLBX of the memory cell array 1, and outputs the data output to the second bit line BLBX in the selected column as read data RDB.

Further, the address decoder 2 independently drives the word lines WLA and WLB in accordance with each of the two read addresses RAA and RAB in read operation, but simultaneously drives the two word lines WLA and WLB having the same address in write operation. For this reason, a switching circuit 6 switches addresses to be input to the address decoder 2 between the read operation and the write operation.

During data read operation, data is read from each of the first bit line BLA and the second bit line BLBX. In other words, the address decoder 2 decodes a read address RAA, and outputs a high-level voltage to the first word line WLA[i] in the row associated with the read address RAA.

Thus, the transistor N3 of the memory cell circuit 10 in that row is turned on, and the data of the first node Q1 is read out to the first bit line BLA. The address decoder 2 also decodes a read address RAB, and outputs a high-level voltage to the second word line WLB[j] in the row associated with the read address RAB. Thus, the transistor N4 of the memory cell circuit 10 in that row is turned on, and data of the second node QX is read out to the second bit line BLA. A case where the read addresses RAA and RAB indicate the same row is also permitted. In this case, the address decoder 2 outputs a high-level voltage to both the first word line WLA[k] and the second word line WLB[k] in the associated row. Thus, the transistors N3 and N4 of the memory cell circuit 10 in that row are turned on, the data of the first node Q is read out to the first bit line BLA, and the data of the second node QX is read out to the second bit line BLBX.

On the other hand, during data write operation, the first bit line BLA and the second bit line BLBX are set as a bit pair, and complementary data segments are output to the bit pair BLA and BLBX. The address decoder 2 outputs a high-level voltage to both the first word line WLA[1] and the second word line WLB[1] in the associated row.

In this embodiment, in order to improve the operating margin during the read operation, i.e., a static noise margin, a high-level voltage to be output to the word lines WLA and WLB is set to be lower during read operation for data having different row addresses than during read operation for data having the same row address or during data write operation.

Figure 3:
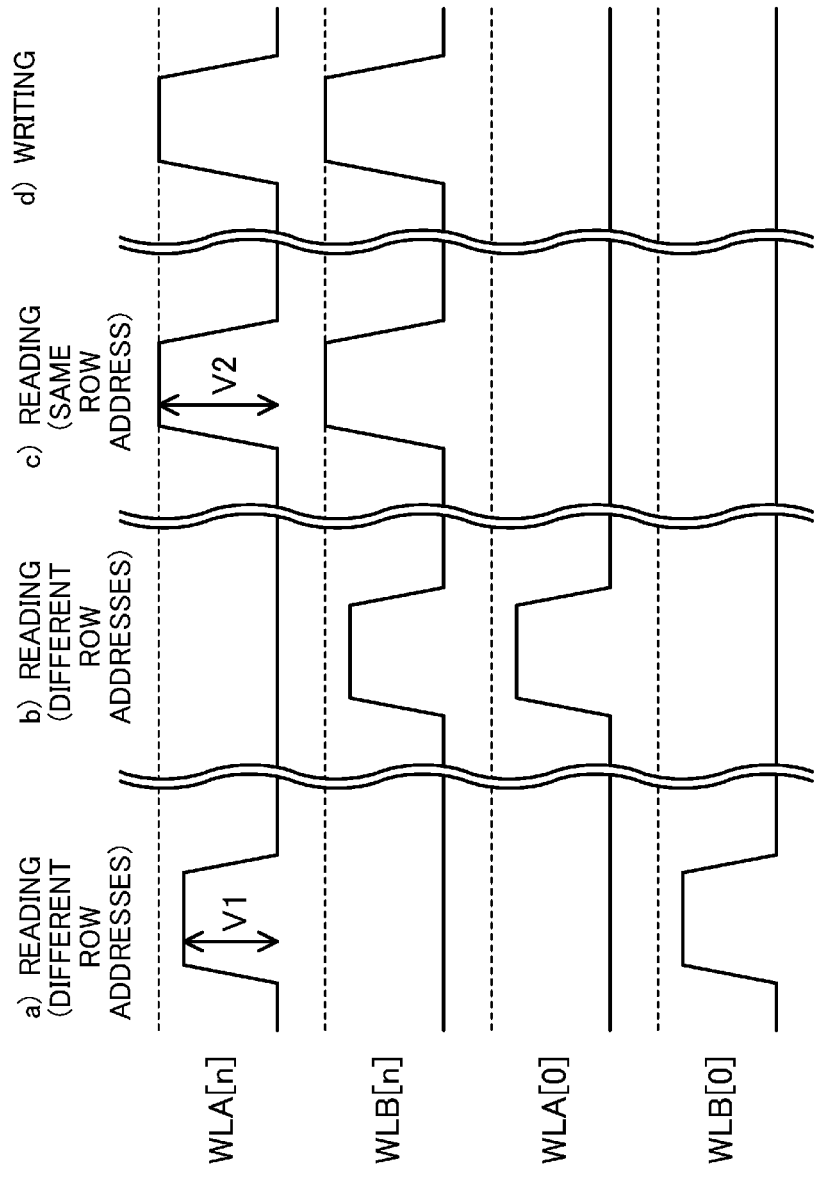
FIG. 3 conceptually illustrates high-level voltages to be output to the word lines.

FIG. 3 conceptually illustrates a difference between the high-level voltages to be output to the word lines WLA and WLB. As shown in FIG. 3, during read operation for data having different row addresses (a, b), a high-level voltage V1 is set to be lower than a high-level voltage V2 during read operation for data having the same row address (c) and during data write operation (d). For example, the voltage V2 is equal to VDD and the voltage V1 is equal to (VDD−α). The value "α" is set to about 10% of VDD, for example. This is because the static noise margin is more deteriorated when only the word line WLA or WLB is set to be high than when both of the word lines WLA and WLB are set to be high. The high-level voltage of the word line WLA or WLB is lowered, such that the driving capabilities of the transistors N3 and N4 which are access transistors are lowered, thereby reducing deterioration of the static noise margin. In the data write operation, since the high-level voltage V2 of the word lines WLA and WLB is not lowered, the driving capabilities of the transistors N3 and N4 which are the access transistors are not lowered. Therefore, the write margin is not deteriorated.

Figure 4:
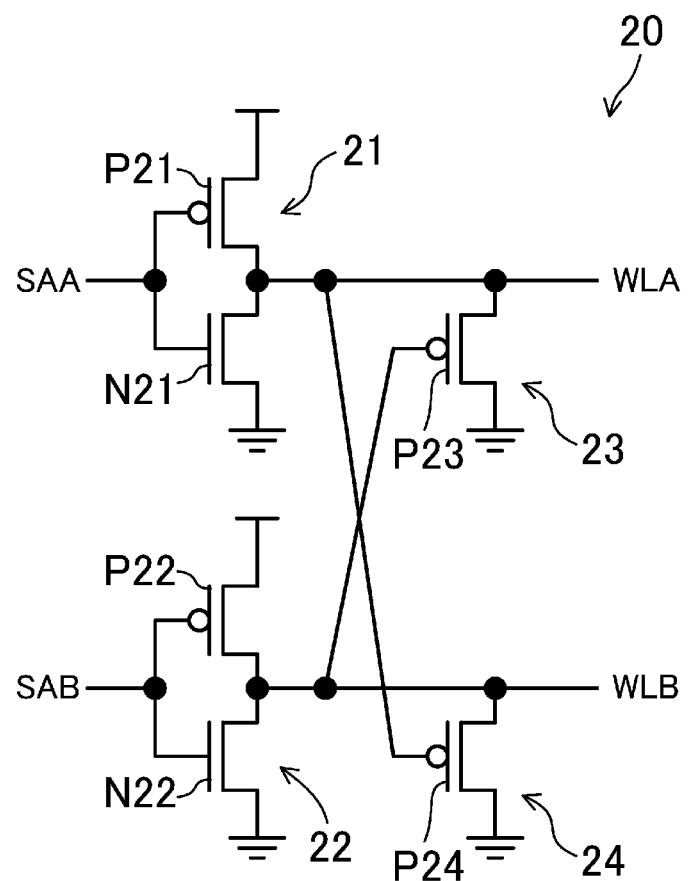
FIG. 4 is a circuit diagram of a word line driver circuit according to the embodiment.

FIG. 4 shows an exemplary configuration for a word line driver circuit according to this embodiment. In the configuration shown in FIG. 2, the word line driver circuit is included in the address decoder 2, and is provided for each row of the memory cell array 1. The word line driver circuit 20 shown in FIG. 4 can output the high-level voltage as shown in FIG. 3 to the word lines WLA and WLB.

In FIG. 4, the word line driver circuit 20 includes a first driver 21 which outputs a high-level voltage to the first word line WLA, and a second driver 22 which outputs a high-level voltage to the second word line WLB. The first driver 21 includes an inverter comprised of transistors P21 and N21, and outputs a high-level voltage when a decoded address signal SAA is active (in this case, at a low level). The second driver 22 includes an inverter comprised of transistors P22 and N22, and outputs a high-level voltage when a decoded address signal SAB is active (in this case, at a low level).

Further, the word line driver circuit 20 includes a first assist portion 23 provided between the first word line WLA and the VSS, and a second assist portion 24 provided between the second word line WLB and the VSS. The resistance value of the first assist portion 23 is smaller when the second driver 22 does not output a high-level voltage than when the second driver 22 outputs the high-level voltage. The first assist portion 23 includes a P-type transistor P23 provided between the first word line WLA and the VSS and having a gate which receives the output of the second driver 22. The resistance value of the second assist portion 24 is smaller when the first driver 21 does not output a high-level voltage than when the first driver 21 outputs the high-level voltage. Here, the second assist portion 24 includes a P-type transistor P24 provided between the second word line WLB and the VSS and having a gate which receives an output of the first driver 21.

In the word line driver circuit 20 shown in FIG. 4, when both of the first and second drivers 21 and 22 output a high-level voltage, both of the first and second assist portions 23 and 24 have a larger resistance value. On the other hand, for example, when only the first driver 21 outputs a high-level voltage, the resistance value of the first assist portion 23 decreases, and therefore, the high-level voltage output to the first word line WLA decreases. Likewise, when only the second driver 22 outputs a high-level voltage, the resistance value of the second assist portion 24 decreases, and therefore, the high-level voltage output to the second word line WLB decreases. Therefore, the word line driver circuit 20 shown in FIG. 4 can output a high-level voltage as shown in FIG. 3 to the word lines WLA and WLB.

Figure 5:
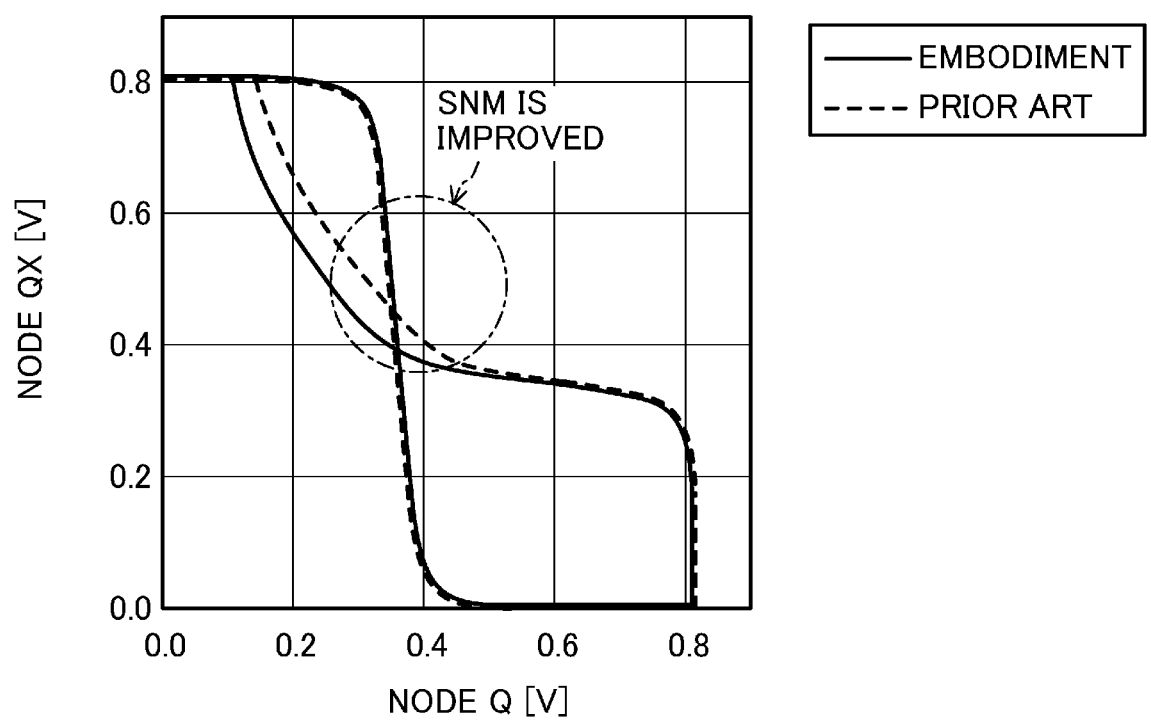
FIG. 5 is a graph showing a static noise margin (SNM).

FIG. 5 is a graph showing a static noise margin (SNM) according to this embodiment. In FIG. 5, a horizontal axis represents a voltage of the first node Q, and a vertical axis represents a voltage of the second node QX. The solid curve indicates this embodiment, and the dashed curve indicates prior art. The curves of this graph are each called a butterfly curve, and the larger two portions surrounded by the curve is, the larger the margin is. As can be seen from FIG. 5, the portions surrounded by the curve is greatly expanded in this embodiment, and the static noise margin is increased. In other words, according to this embodiment, a static noise margin is reliably secured.

As described above, according to this embodiment, the semiconductor storage device includes the memory cell circuit 10 which constitutes the dual-port SRAM cell comprised of six transistors P1, P2, and N1 to N4. Then, when driving the first or second word line WLA or WLB, the word line driver circuit 20 lowers the high-level voltage which is to be output to the driven word line such that the high-level voltage is lower than the high-level voltage which is to be output to both of the first and second word lines WLA and WLB when driving both the first and second word lines WLA and WLB. In this way, the static noise margin is improved. Accordingly, it is possible to provide a semiconductor storage device having a dual-port SRAM cell with a smaller area and low-current consumption, and to secure a good static noise margin.

<Other Exemplary Configuration for Word Line Driver Circuit>

Figure 6A:
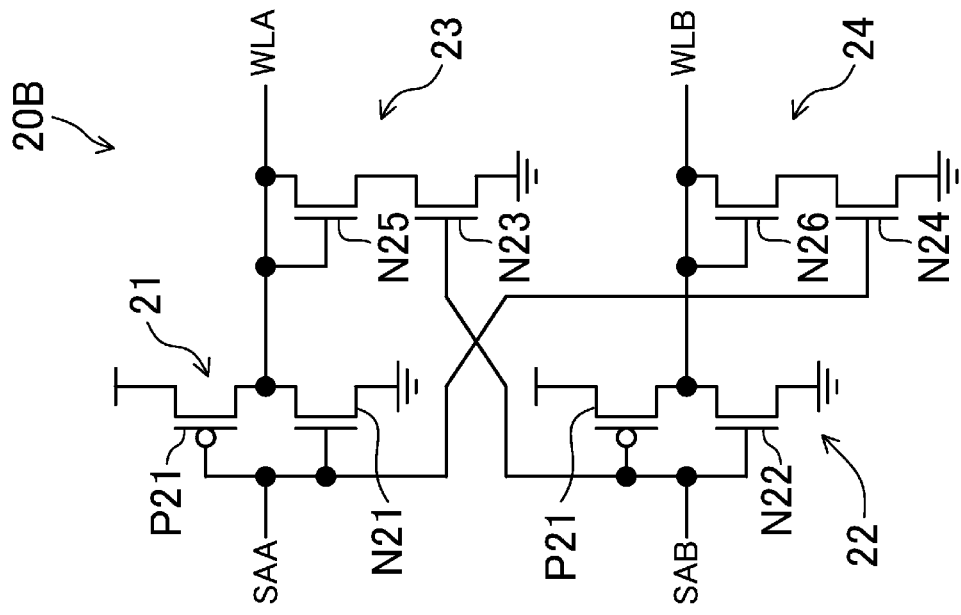
FIG. 6A is a circuit diagram of another word line driver circuit.
Figure 6B:
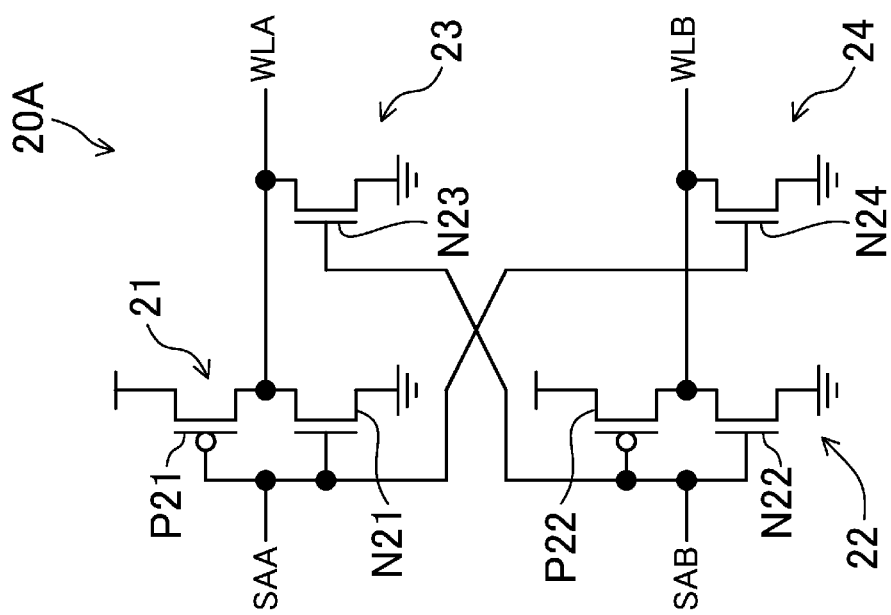
FIG. 6B is a circuit diagram of yet another word line driver circuit.
Figure 7A:
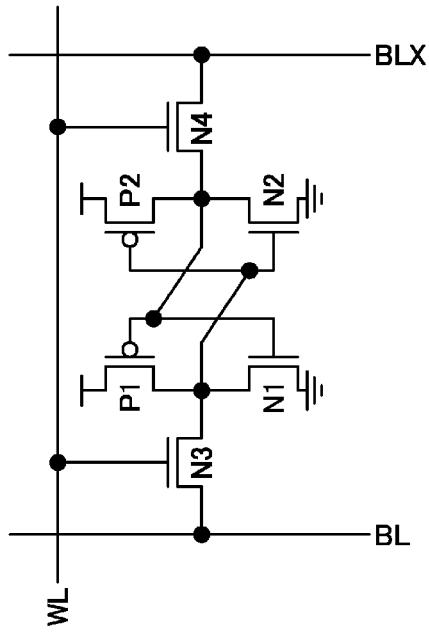
FIG. 7A is a circuit diagram of a typical dual-port SRAM cell.
Figure 7B:
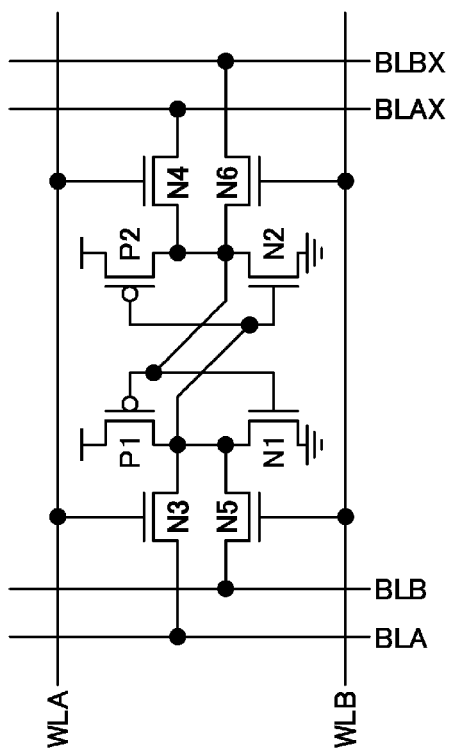
FIG. 7B is a circuit diagram of a typical one-port SRAM cell.

FIGS. 6A and 6B show exemplary configurations for other word line driver circuits according to the embodiment. In a word line driver circuit 20A shown in FIG. 6A, the first assist portion 23 includes an N-type transistor N23 provided between the first word line WLA and the VSS and having a gate which receives the input of the second driver 22. The second assist portion 24 includes an N-type transistor N24 provided between the second word line WLB and the VSS and having a gate which receives the input of the first driver 21. In a word line driver circuit 20B shown in FIG. 6B, the first assist portion 23 includes a diode-connected N-type transistor N25 between the first word line WLA and the N-type transistor N23. The second assist portion 24 includes a diode-connected N-type transistor N26 between the second word line WLB and the N-type transistor 24.

In FIGS. 6A and 6B, the resistance value of the first assist portion 23 is smaller when the second driver 22 does not output a high-level voltage than when the second driver 22 outputs the high-level voltage. The resistance value of the second assist portion 24 is smaller when the first driver 21 does not output a high-level voltage than when the first driver 21 outputs the high-level voltage. Therefore, either of the word line driver circuits 20A and 20B can output the high-level voltage as shown in FIG. 3 to the word lines WLA and WLB.

The present disclosure can provide a semiconductor storage device having a dual port SRAM cell with a smaller area and low-current consumption, and can secure a good static noise margin. Therefore, the present disclosure is useful for improving the performance of a semiconductor storage device.

What is claimed is:

1. A semiconductor storage device comprising:
   a memory cell circuit connected to first and second word lines and first and second bit lines; and
   a word line driver circuit configured to drive the first and second word lines, wherein
   the memory cell circuit includes:
      a first P-type transistor provided between a high-potential power supply line and a first node;
      a first N-type transistor provided between the first node and a low-potential power supply line, and having a gate connected to a gate of the first P-type transistor;
      a second P-type transistor provided between the high-potential power supply line and a second node;
      a second N-type transistor provided between the second node and the low-potential power supply line, and having a gate connected to a gate of the second P-type transistor;
      a third N-type transistor provided between the first node and the first bit line, and having a gate connected to the first word line; and
      a fourth N-type transistor provided between the second node and the second bit line, and having a gate connected to the second word line;
   the first node is connected to the gate of the second P-type transistor and the gate of the second N-type transistor, and the second node is connected to the gate of the first P-type transistor and the gate of the first N-type transistor, and
   when driving the first or second word line, the word line driver circuit makes a high-level voltage which is to be output to the driven word line lower than a high-level voltage which is to be output to both the first and second word lines when driving both the first and second word lines.

2. The semiconductor storage device of claim 1, wherein the word line driver circuit includes:
   a first driver configured to output a high-level voltage to the first word line when an input is active;
   a second driver configured to output a high-level voltage to the second word line when an input is active;
   a first assist portion provided between the first word line and the low-potential power supply line, configured to receive an input or output of the second driver, and having a resistance value which is smaller when the second driver does not output the high-level voltage than when the second driver outputs the high-level voltage; and a second assist portion provided between the second word line and the low-potential power supply line, configured to receive an input or output of the first driver, and having a resistance value which is smaller when the first driver does not output the high-level voltage than when the first driver outputs the high-level voltage.

3. The semiconductor storage device of claim 2, wherein the first assist portion includes a P-type transistor provided between the first word line and the low-potential power supply line, and having a gate which receives the output of the second driver, and the second assist portion includes a P-type transistor provided between the second word line and the low-potential power supply line, and having a gate which receives the output of the first driver.

4. The semiconductor storage device of claim 2, wherein the first assist portion includes an N-type transistor provided between the first word line and the low-potential power supply line, and having a gate which receives the input of the second driver, and the second assist portion includes an N-type transistor provided between the second word line and the low-potential power supply line, and having a gate which receives the input of the first driver.

* * * * *